United States Patent [19]

Sekiguchi et al.

[11] Patent Number: 5,744,377

[45] Date of Patent: Apr. 28, 1998

[54] METHOD FOR FORMING A THIN FILM AND APPARATUS OF FORMING A METAL THIN FILM UTILIZING TEMPERATURE CONTROLLING MEANS

[75] Inventors: Atsushi Sekiguchi; Tsukasa Kobayashi; Shinji Takagi, all of Fuchu, Japan

[73] Assignee: Anelva Corporation, Tokyo, Japan

[21] Appl. No.: 561,747

[22] Filed: Nov. 22, 1995

Related U.S. Application Data

[63] Continuation of Ser. No. 9,446, Jan. 27, 1993, Pat. No. 5,594,280, which is a continuation-in-part of Ser. No. 760,830, Sep. 18, 1991, abandoned, which is a continuation of Ser. No. 466,562, Jan. 17, 1990, abandoned, which is a division of Ser. No. 424,796, Oct. 20, 1989, abandoned, which is a division of Ser. No. 253,820, Oct. 6, 1988, Pat. No. 4,963,423.

[30] Foreign Application Priority Data

| Oct. 8, 1987 | [JP] | Japan | 62-254268 |
| Feb. 2, 1988 | [JP] | Japan | 63-22463 |
| Mar. 25, 1988 | [JP] | Japan | 63-71160 |

[51] Int. Cl.$^6$ ........................................ H01L 21/44
[52] U.S. Cl. .................. 438/674; 427/99; 438/675; 438/680; 438/688
[58] Field of Search ....................... 437/194, 197, 437/198, 199, 245; 427/99; 438/674, 675, 680, 681, 688

[56] References Cited

U.S. PATENT DOCUMENTS

| 4,325,776 | 4/1982 | Menzel | 156/610 |
| 4,554,030 | 11/1985 | Haisma et al. | |
| 4,800,176 | 1/1989 | Kakumu et al. | 437/193 |
| 4,874,494 | 10/1989 | Ohmi | |
| 5,148,259 | 9/1992 | Kato | 257/771 |
| 5,262,361 | 11/1993 | Cho et al. | 437/245 |

FOREIGN PATENT DOCUMENTS

| 0049767 | 4/1977 | Japan | 357/67 |
| 0095949 | 5/1985 | Japan | 357/67 |
| 0008971 | 1/1986 | Japan | 357/67 |
| 0185975 | 8/1986 | Japan | 357/67 |
| 62-123716 | 6/1987 | Japan | |

OTHER PUBLICATIONS

"Observation of Initial Stage of Al Epitaxial Growth on Si(III) by Ionized Cluster Beam Deposition"—Inokawa et al—Japanese Journal of Applied Physics, vol. 24, No. 3, Mar. 1985 pp. L173–L174.

(List continued on next page.)

Primary Examiner—John Niebling
Assistant Examiner—C. Everhart
Attorney, Agent, or Firm—Pollock, Vande Sande & Priddy

[57] ABSTRACT

In an aparatus for forming an aluminum thin film, or an aluminum alloy thin film useful to an interconnecting material of an electronic device, there are provided:

a processing chamber capable of keeping a vacuum condition therein;

a substrate holder mounted within said processing chamber, for holding a substrate and performing a temperature adjustment;

a first temperature adjusting mechanism for performing the temperature adjustment of said substrate via said substrate holder;

a gas conducting mechanism for conducting a predetermined gas into said processing chamber;

an exhausting mechanism for exhausting an interior of said processing chamber;

a distributing plate provided within said processing chamber, for uniformly supplying said predetermined gas to a surface of said substrate; whereby a part of element consisting said predetermined gas is deposited on the surface of said substrate; and a second temperature adjusting mechanism for adjusting the temperature of said distributing plate.

15 Claims, 5 Drawing Sheets

OTHER PUBLICATIONS

Levy et al "Characterization of LPCVD Aluminum for VLSI Processing" J. Electrochem Soc. Solid–State Science and Technology, Sep. 1984.

Yamada et al—"Metallization by Ionized Cluster Beam Deposition"—IEEE Transactions on Electron Devices, vol. ED–34 No. 5 May 1987 pp. 1018–1025.

Contolini et al., "Properties of LPCVD Aluminum Films Produced by Disproportionation of Aluminum Monochloride"—J. Electrochem. Soc, vol. 132 No. 2 Feb. 1985, pp. 457–463.

Yamada et al., "Epitaxial Growth of Al on Si III and Si by Ionized Cluster Beam"—J Appl. Phys 56(10), 15 Nov. 1984, pp. 2746–2750.

Green et al, "Characterization of LPCVD Aluminum for VLSI Processing", J. Electrochem Soc. vol. 131, No. 9, Sep. 1984, pp. 2175–2182.

Hartsough, L., Aluminum and Aluminum Alloy Sputter Deposition for VSLI, Solid State Technology, Dec. 1979, pp. 66–72.

Ghandhi, S., VLSI Fabrication Principles, 1983, p. 448.

M.L. Green et al "Aluminum films prepared by metal–organic low pressure chemical vapor deposition" *Thin Solid Films* 114 (1984, month unknown) pp. 367–377.

Kato, et al., "Magnetron–Plasma CVD System and Its Application to Aluminum Film Deposition," Extended Abstracts of the 18th (1986 International) Conference on Solid State Devices and Materials, Tokyo 1986, pp. 495–498.

Solanki, et al., "Photodeposition of Aluminum Oxide and Aluminum Thin Films," Applied Physics Lett., 43 (5), 1 Sep. 1983.

Holzl, "III.2 Grain Refinement by Thermomechanical Means," Proceedings of the 6th International Conference on Chemical Vapor Deposition, The Electrochemical Society, Princeton 1977, pp. 107–114.

Dutta, et al., "Characterization and Properties of Controlled Nucleation Thermochemical Deposition (CNTD)—Silicon Carbide," Journal of Materials Science, 15 (1980) pp. 2183–2191.

Biswas, et al., "Vapor Phase Deposition of Aluminum Film on Quartz Substrate," J. Electrochem. Soc., vol. 130, No. 1.

Egger, "Kinetics of the Intramolecular Four–Center Elimination of Isobutylene from Triisobutylaluminum in the Gas Phase," Journal of the American Chemical Society, 91:II May 21, 1969, pp. 2868–2871.

Higashi, et al., "Patterned Aluminum Growth via Excimer Laser Activated Metalorganic Chemical Vapor Deposition," Applied Physics Letter, 48 (16), 21 Apr. 1986, pp. 1051–1053.

Lander, et al., "Surface Reactions of Silicon with Aluminum and with Indium," Surface Science 2 (1964) 553–565.

Harris, et al., "Solid–phase Crystallization of Si Films in Contact with Al Layers," Journal of Applied Physics, vol. 48, No. 7, Jul. 1977 pp. 2897–2904.

McLeod, et al., "Effects of Sputter Etching and Process Techniques on the Properties of Sputtered Aluminum Films," J. Vac. Sci. Technol., 16 (2) Mar./Apr. 1979, pp. 369–376.

Pierson, "Aluminum Coatings by the Decomposition of Alkyls," Thin Solid Films, 45 (1977) 257–263.

Learn, et al., "Methods for Minimizing Silicon Regrowth in Aluminum Films," Appl. Phys. Lett., 35 (8), 15 Oct. 1979, pp. 611–614.

Malazgirt, et al., "Production of Aluminum and Aluminum Coatings by Thermal Decomposition of Aluminum Alkyls," Metallurgical Transactions, vol. 11B, Jun. 1980, pp. 225–232.

Fukuyama, et al., "Deposition of Si–Doped Al Film by Reactive Sputtering," Jpn. J. Appl. Phys., vol. 18 (1979), No. 5, pp. 987–988.

Takamatsu, et al., "Fundamentals of Low Pressure Deposited CVD Aluminum for VLSI Metallization," Abstract No. 334.

Nakamura, "Recent Advance in Multilevel Interconnection," Extended Abstracts of the 19th Conference on Solid State Devices and Materials, Tokyo, 1987, pp. 403–406.

Cooke, et al., "LPCVD of Aluminum and Al–Si Alloys for Semiconductor Metallization," Solid State Technology, Dec. 1982, pp. 62–65.

Higashi, et al., "Summary Abstract: Nucleation Considerations in the Wavelength–dependent Activation Selectivity of Aluminum Chemical–vapor Deposition," J. Vac. Sci. Technol. B 5 (5). Sep./Oct. 1987, pp. 1441–1443.

Levy, et al., "Low Pressure Chemical Vapor Deposition of Tungsten and Aluminum for VLSI Applications," Journal of the Electrochemical Society—Reviews and News, Feb. 1987, pp. 37C–49C.

Suzuki, et al., Formation of Al Films on Pitch–base Carbon Fibers from Tri–iso–butyl Aluminum by Reduced–pressure CVD,: J. Japan Inst. Metals, vol. 51, No. 6 (1987), pp. 577–583.

Horiguchi, et al., "Molecular Beam Epitaxial Growth of GaAs Using Triethylgallium and Arsine," Japanese Journal of Applied Physics, vol. 25, No. 12, Dec. 1986, pp. L979–L982.

Amazawa, et al., "Selective Chemical Vapor Deposition of Aluminum," Extended Abstracts of the 18th (1986) International) Conference on Solid State Devices and Materials, Tokyo, 1986, pp. 755–756.

Suzuki, et al., "Pyrolysis and Photolysis of Trimethylaluminum," Japanese Journal of Applied Physics, vol. 25. No. 8, Aug., 1986, pp. 1236–1242.

Levy, et al., "OPCVD Aluminum for VLSI Processing," SEMICON/East 1985 Technical Program Proceedings, at the Bayside Exposition Center, Boston, Massachusetts, on Sep. 17–19, 1985, presented by Semiconductor Equipment and Materials Institute, Inc.

Green, et al., "Structure of Selective Low Pressure Chemically Vapor–Deposited Films of Tungsten," J. Electrochem. Soc., vol. 132, No. 5, May, 1985, pp. 1243–1250.

Levy, et al., "Properties of LPCVD Aluminum Films Products by Disproportionation of Aluminum Monochloride," J. Electrochem. Soc., vol. 132, No. 2, Feb., 1985, pp. 457–463.

Levy, et al., "In–Source Al–0.5% Cu Metallization for CMOS Devices," J. Electrochem. Soc., vol. 132, No. 1, Jan., 1985, pp. 159–168.

Kobayashi, T., "Epitaxial Growth of Al on Si by Gas–Temperature–Controlled Chemical Vapor Deposition," Japanese Journal of Applied Physics, vol. 27, No. 9, Sep., 1988, pp. L1775–1777.

Article A: Kazuo Maeda "Present State of CVD Insulation Film Forming Technique and Positioning 'TEOS'", Kabushiki Kaisha Handotai Process Kenkyujo, Sep. 1988.

Article B: J. Vac. Sci. Technol. A 10(3), May/Jun. 1992, pp. 525–538.

Article D: "Gas–Temperature–Controlled (GTC) CVD of Aluminum and Aluminum–Silicon Alloy Film for VLSI Processing", Japanese Journal of Applied Physics, vol. 27, No. 11, pp. L2134–L2136, Nov. 1988.

Article E: "Features of Al Film formed by Epitaxial CVD Method and CVD Device", Semiconductor World, pp. 39–41, Sep. 1989.

Article F: "Epitaxial Growth of Al on Si By Gas–Temperature–Controlled CVD", Materials Research Society Proc., vol. 131, 1989.

Article G: "CVD Aluminum on Silicon", Workshop on W and other Metals for ULSI/VLSI Application VI, pp. 81–85, Jul. 7, 1989.

Article H: "Epitaxial Growth of Al(100) on Si(100) by Gas–Temperature–Controlled Chemical Vapor Deposition", Extended Abstracts of the 21st Conference on Solid Devices and Materials, pp. 29–32, Aug. 28–30, 1989.

Article I: "Epitaxial Growth of Al(100) on Si(100) by Gas–Temperature–Controlled Chemical Vapor Deposition", J. Ac. Sci. Technol. A8(3), May/Jun. 1990, pp. 2976–2979.

Article J: "Growth of Single Crystalline Al Films by Gas–Temperature–Controlled CVD", Vacuum, vol. 33, No. 3, pp. 214–216 1990.

METHOD FOR FORMING A THIN FILM AND APPARATUS OF FORMING A METAL THIN FILM UTILIZING TEMPERATURE CONTROLLING MEANS

This application is a continuation of U.S. patent application Ser. No. 08/009,446, filed Jan. 27, 1993, now U.S. Pat. No. 5,594,280, which is a continuation-in-part of U.S. patent application Ser. No. 07/760,830, filed Sep. 18, 1991, now abandoned, which is a continuation of U.S. patent application Ser. No. 07/466,562, now abandoned, filed Jan. 17, 1990, which is a divisional of U.S. patent application Ser. No. 07/424,796, filed Oct. 20, 1989, now abandoned, which is a divisional of U.S. patent application Ser. No. 07/253,820, filed Oct. 6, 1988, now U.S. Pat. No. 4,963,423.

BACKGROUND OF THE INVENTION

1. Field of the Invention

The present invention generally relates to a method for forming a thin film employed in a semiconductor device, a sensor, an electronic component by thermally resolving a gas, and a thin film forming apparatus, and moreover an electronic device. More specifically, the present invention is directed to a method for forming an aluminum thin film or an aluminum-alloy thin film on a substrate surface, an apparatus of forming such a metal thin film, and an electronic device such as a semiconductor integrated circuit and opto-electronic devices employing an aluminum film or aluminum alloy film as a metalizing material.

2. Description of the Related Art

FIG. 1 is a cross-sectional view of the conventional film forming apparatus. Reference numeral 1 in a processing chamber which can maintain an air tight condition therein. Reference numeral 3 denotes a substrate holder which is positioned within the processing chamber 1, holds a substrate 2, and adjusts a temperature of the substrate 2. A temperature adjusting mechanism 20 for adjusting the temperature of the substrate holder 3 will now be described. A b eater 4 is employed to heat the substrate holder 3 by means of resistor her heating methods such as radiation heai a etinalized). A thermocouple 5 is used to monitor the temperature of the substrate holder 3. A temperature sensing resistor may be employed instead of the thermocouple 5 as the temperature monitor. A measurement signal from the thermocouple 5 is input into a control circuit such as PID control, PI control, ON-OFF control and the like (not shown in detail), and input power to the heater 4 is controlled by employing a thyristor or relay so that the temperature of the substrate holder 3 is adjusted. The substrate holder 3 may be cooled, if required, to control the temperature thereof by way of the heating/cooling methods.

A predetermined gas 8 is conducted via a valve 7 from a gas supply apparatus (not shown). To uniformly supply this gas 8 into the substrate surface, a distributing plate 6 is employed which includes narrow holes such as multi-overlapped meshes for passing a large quantity of gas therethrough.

The above-described gas 8 which has been conducted into the processing chamber 1 is thermally resolved on the substrate 2, and a predetermined thin film is formed on the surface.

If the processing pressure contained within the processing chamber 1 is higher than 1 atm, the remaining reaction gas 11 is often exhausted via the valve 9 in a natural method. If the processing pressure is reduced below 1 atm, the resi dual reaction gas 8 is exhausted by way of the oil rotating pump or a combination of the roots vacuum pump and oil rotating pump.

When employing the conventional film forming apparatus shown in FIG. 1, an alumin um thin film is formed on the surface of the substrate 2 by utilizing, as the conducted gas, triethyl aluminum or tri-isobutyl aluminum which is hydrogen-diluted. Then, the following problems occur.

If the temperature of the substrate 2 is low, e.g., below approximately 400° C., the sufficient film forming speed of the aluminum cannot be obtained. Also, since a whisker-shaped crystal and/or filament-shaped crystal are formed, no flat aluminum thin film is formed. As such arn aluminum thin film containing the whisker-shaped crystal, or filament-shaped crystal is not a mirror-surfaced film, the mask alignment for forming IC patterns cannot be performed and the resistivity of the formed film becomes great.

When, on the other hand, the temperature of the substrate 2 is higher than, e.g., about 400° C., the sufficient film forming speed of the aluminum can be obtained, for instance, at 1000 Å/minutes or higher. Carbon or hydrocarbon originated from the ethyl radical, or isobutyl radical under the free state is mixed into the aluminum, so that the surface of the formed film is colored in brown or dark white.

There are many problems to *utilize such a thin film as the thin film for IC interconnects, because the resistance value of this thin film is higher than that of the pure aluminum thin film.

If silicon is in contact with aluminum, this silicon is diffused into aluminum due to the high temperature, which may give an adverse influence to the characteristics of the electronic devices and cause large variations in the characteristics.

In general, as the metalizing materials for semiconductor devices, electronic components, and sensors, an aluminum thin film, or aluminum-alloy thin film is employed. Most of these aluminum-alloy thin films are manufactured by using the sputtering method.

While an integration degree of a semiconductor device is increased, and thus the pattern size thereof becomes narrower and narrower, the defects of the covering characteristics of the thin film manufactured in accordance with the conventional sputtering method at the step pattern, are particularly remarkable. Reliability at the step will be lowered and accordingly, there is a risk of circuit breakdowns.

M. L. Green et al. have proposed that the aluminum film is formed by the low pressure CVD (chemical vapor deposition) method by employing tri-isobutyl aluminum as a source material (described in "Thin Solid Films" vol. 114, pages 367–377, issued in 1984). According to this manufacturing method, the aluminum film having the better covering characteristics can be manufactured.

If, however, the pure aluminum is employed as the metalizing material, and the density of the current flowing through the pure aluminum film is great, aluminum atoms arce transferred due to the electromigration, so that the circuit breakdowns or short circuits may occur. In addition, at the boundaries between the silicon substrate and aluminum, the aluminum penetrates into the silicon readily, which is brought into the instable boundary characteristics.

To prevent the above-described electromigration and stabilize the boundaries, it is known to employ an aluminum-silicon alloy which is made by conducting a small quantity of silicon into aluminum. According to the conventional sputtering method, the aluminum-silicon alloy film can be easily obtained by employing the aluminum-silicon material as the target material. However, it is also difficult to obtain the aluminum-silicon film having the better step coverage.

Also, M. J. Cooke et al. attempted another method by which silicon is contained into the aluminum film fabricated by the low pressure CVD method (described in "Solid State Technology", December 1982, pages 62–65). In accordance with this method, after the aluminum film is manufactured by utilizing tri-isobutyl aluminum as the material gas by way of the low pressure CVD method, the temperature of the substrate having the aluminum film is increased and then, in contact with silane, so that the aluminum-silicon film could be obtained.

In accordance with the above-described film forming method proposed by M. J. Cooke et al., there is a drawback that better mass productivity to form the aluminum-silicon film cannot be expected because of two manufacturing steps.

In general, the surface flatness of the aluminum alloy film is represented by reflecting of light. The aluminum alloy film having a thickness of 0.8 to 1 µm, utilized as a normal interconnecting film, manufactured by M. J. Cooke et al., owns the light reflectivity of 10 to 20%. This implies that a large quantity of concave and convex portions are formed on the surface of the resultant aluminum alloy film, and a very poor aluminum alloy film is obtained.

This reflectivity characteristic has an important role such that not only a degree of surface roughness is represented, but also the pattern alignment is enabled in the device processing step. As a consequence, it is impossible to perform the pattern alignment unless the light Ireflectivity exceeds over a predetermined threshold value. As this threshold value, the resultant light reflectivity must be more than 50%. Since the pattern alignment during the device processing step for the film fabricated by M. J. Cooke et al., cannot be executed, it is very difficult to introduce this conventional method into the manufacturing stage of the thin film.

Another conventional problem is present in the film forming velocity.

The film forming velocity according to the method of M. L. Green et al. is, for instance, on the order of 30 nm/mmn, whereas it is 200 nm/mmn at maximum, and normally 15±5 nm/min according to M. J. Cooke et al.'s method. Both the film forming velocities are considerably lower than 500 nm/min, as the practical mass-production velocity level.

It is very internally diffusive between a silicon substrate and pure aluminum. Accordingly, even if pure aluminum is merely deposited on the silicon substrate, aluminum on the surface of the substrate diffuses into silicon, and the boundary characteristic is deteriorated. As a consequence, such a process is required that silicon is contained in the aluminum film, which is simultaneously effected with the deposition.

Most of the conventional electronic devices employ the aluminum films manufactured by the vapor deposition method or sputtering method as the interconnecting material, because the aluminum films have low resistivity and better stability. However, if the aluminum films manufactured according to the above-described method are utilized as the interconnecting material in the silicon semiconductor devices, the internal diffusion between silicon as the substrate and aluminum becomes great so that the stability at the contact portion is deteriorated (referred to as "penetration"), and in order to prevent occurrence of electromigration and stress-migration, the aluminum-silicon alloy film is employed as the interconnecting. material.

It should be noted that the aluminum-silicon alloy film defined in the specification contains such a film that silicon is present (or segregated) in the grains and grain boundaries of aluminum-silicon.

FIG. 2 illustrates a schematic diagram of an N type silicon gate MOS (metal oxide semiconductor which has been known in the art).

In this figure, reference numeral 30 denotes a P type silicon substrate doped by boron. Reference numeral 12 represents a silicon oxide film formed by exposing the substrate 30 into the high temperature atmosphere so as to grow it therein. Reference numeral 13 indicates an $N^+$ layer formed by patterning the silicon oxide film 12 and ion-injecting phosphorus ion injection into this patterned portion. Reference numeral 14 is a silicon oxide film grown on the $N^+$ layer 13 by way of the CVD method. Reference numeral 15 represents a gate oxide film fabricated in such a way that after the silicon oxide film 14 is patterned, the patterned silicon oxide film 14 is exposed into the high temperature oxide atmosphere to grow it. Reference numeral 16 is a polysilicon gate layer grown on the gate oxide film 15. Reference numeral 17 indicates an aluminum film, or aluminum-silicon alloy film (simply referred to as an "aluminum film") fabricated over the entire substrate 30 by way of the vapor deposition method, sputtering method, thermal CVD method, or the like. Reference numeral 18 denotes a silicon tungsten film formed by the CVD method or sputtering method in order to reduce the surface reflectivity of the aluminum film 17. Reference numeral 19 represents a passivation film such as silicon nitride.

Normally, thickness of the aluminum film 17 fabricated by the vapor or sputtering method as the interconnecting material for the semiconductor device having the above-described structure is 1 µm approximately. However, as shown in FIG. 3, grains 22 having on the order of 1.5 µm are formed. If such grains 22 are formed, the electromigration occurs from the conjunction part between the grains 22, with the result that the electronic device characteristic is varied, the circuit breakdowns may occur or the shortcircuit problems may occur. In addition, a hillock (a hill-shaped projection) may be produced on the aluminum interconnects due to the anneal required for the subsequent manufacturing process.

To avoid such conventional problems, copper is furthermore added to this aluminum-silicon alloy, and this copper is segregated on the conjunction part between thes grains so as to improve the characteristic of this conjunction part, very recently. As a result, occurrences of the electromigration or stress-migration can be avoided. However, if copper is added as described above, this copper remains as the unetched remainder when the patterning of the aluminum-silicon-copper alloy film is carried out by the dry etching process.

To eliminate this copper remainder, the ion sputter etching may be also carried out. However, this ion sputter etching process may cause damages in the resist, or the characteristic of the device is varied by irradiating the high energy ion.

The growth of the aluminum film 17 by the thermal CVD is described in the following publications:
(1) [LPCVD ALUMINUM FOR VLSI PROCESSING] R. A. Levy and M. L. Green J. Electrochem. Soc. 134 (1987) P37c
(2) [LPCV of Aluminum and Al-Si Alloys for Semiconductor Metallization] M. J. Cooke R. A. Heinecke R. C.Stern Solid State Technology December 1982 P62–65

The thermal CVD methods described in the above publications employ the similar hot-wall type CVD apparatuses. That is, the substrate is aligned in the reaction chamber made of the quartz glass tube, and the process gas is flown along the axial direction of the quartz glass tube heated in the furnace from the outside of the quartz glass tube.

By employing this thermal CVD method, the aluminum film is manufactured, so that the step coverage can be improved. However, as the surface of the film fabricated becomes rough (reflectivity: about 10 to 20%), the conjunction condition between the grains is deteriorated so that the electromigration or stress-migration may occur.

The cluster ion beam vapor deposition method and magnetron plasma CVD method have been known from thus below-mentioned publications so as to form the aluminum film having the better surface flatness. That is to say, (3) "Aluminum film forming and crystallinity control by ICB-method", Monthly Japanese magazine "Semiconductor world" 1987, March, Page 75 by Yamada and Takagi.

According to the method described in the aboves publication, the crucible containing aluminum is heated, the cluster is produced under high vacuum conditions, the cluster beam is ionized by the electron bombardment to obtain the ionized cluster beam, whereby this ionized cluster beam is irradiated onto the substrate to form the film thereon.

However, the aluminum film manufactured according to this method has the following drawback. That is, as illustrated in FIG. 4, the covering characteristic of the step coverage portion 24 is not good so that there is a risk of the circuit breakdown, As a result, this aluminum film cannot be employed as the interconnecting material for the electronic devices.

(4) "Aluminum film formation by MPCVD", monthly Japanese magazine "Semiconductor World"

1987, March, Page 84 b y Kato and Ito.

In accordance with the above-mentioned method, the N-pole and S-pole magnets are grounded on the back surface of the substrate holder maintained at the ground potential, with rotation conditions, and the RF power is supplied to4 the gas blow out portion positioned opposite to ths. substrate, so that the magnetron plasma CVD method is carried out.

As a result of this conventional method, in the formed aluminum films, carbon may be mixed on the order of several percents, and the resistivity thereof is about 4 to 10 μΩ·cm, i.e., great. Consequently, although the inherent feature of the aluminum film interconnect is its lower resistivity (2.7 μΩ·cm), the aluminum films fabricated by this method cannot be sufficiently utilized for this purpose because of their higher resistivity.

SUMMARY OF THE INVENTION

It is therefore an object of the present invention to solve the above-described conventional drawbacks, and to provide a novel film forming apparatus and a novel film forming method capable of forming a thin film of a better quality at a low temperature by heating the distributing plate so as to preliminarily thermal-change the conducted gas, and thereafter by supplying the gas to the substrate surface.

It is another object of the present invention to provide a method capable of forming an aluminum alloy film having the better surface flatness at a high speed by employing the low pressure CVD process.

It is a still further object of the present invention to provide an electronic device with a stable characteristic, wherein an aluminum film having a small number of grains, better surface flatness, and improved characteristic of step coverages is utilized as the interconnecting material of the electronic device, whereby an occurrence of electromigration, stress-migration, and/or hillock is prevented.

To achieve the primary object, the film forming apparatus according to the invention, comprises a processing chamber capable of keeping a vacuum condition therein;

a substrate holder mounted within said processing chamber, for holding a subs trate and performing a temperature ad ustment;

a first temperature adjusting mechanism for performing the temperature adjustment of said substrate via said substrate holder; whereby a part of the element constituting said predetermined gas is deposited on the surface of said substrate;

a gas conducting mechanism for conducting a predetermined gas into said processing chamber;

an exhausting mechanism for exhausting an interior of said processing chamber;

a distributing plate provided within saids processing chamber, for uniformly supplying said predetermined gas to a surface of said substrate; and a second temperature adjusting mechanism for adjusting the temperature of said distributing plate.

Also to achieve the secondary object, the film forming method according to the invention, wherein a gas mixture containing at least two sorts of gases is resolved and reacted, and the thin film containing elements of said two sorts of gases is formed on a surface of substrate which has been heated to a predetermined temperature,. characterized in that:

one of said two sorts of gas mixture is one of ma gas of a compound containing aluminum and a gas mixture thereof (referred to as "a gas containing aluminum"), and the other of said gas mixture is one of a gas of a compound containing a metal other than aluminum, and a gas mixture thereof (referred to as "a gas containing a metal"), and the resultant thin film is an alloy film of aluminum and said metal.

Furthermore, to achieve the third object, the electronic device according to the invention has an interconnecting material formed from one of an aluminum film and an aluminum alloy film, said film being formed by the following steps of:

heating a predetermined-gas to produce a thermal variation at a first stage;

supplying said heated gas to a surface of a substrate; and forming said film by way of a thermal CVD (chemical vapor deposition) method on said surface of said substrate which is heated to produce a thermal variation in a second stage.

BRIEF DESCRIPTION OF THE DRAWINGS

For a better understanding of these and other objects of the present invention, reference is made to the following detailed description of the invention to be read in conjunction with the following drawings, in which.

DETAILED DESCRIPTION OF PREFERRED EMBODIMENTS

Construction of First Thin Film Forming Apparatus

Figure 5:
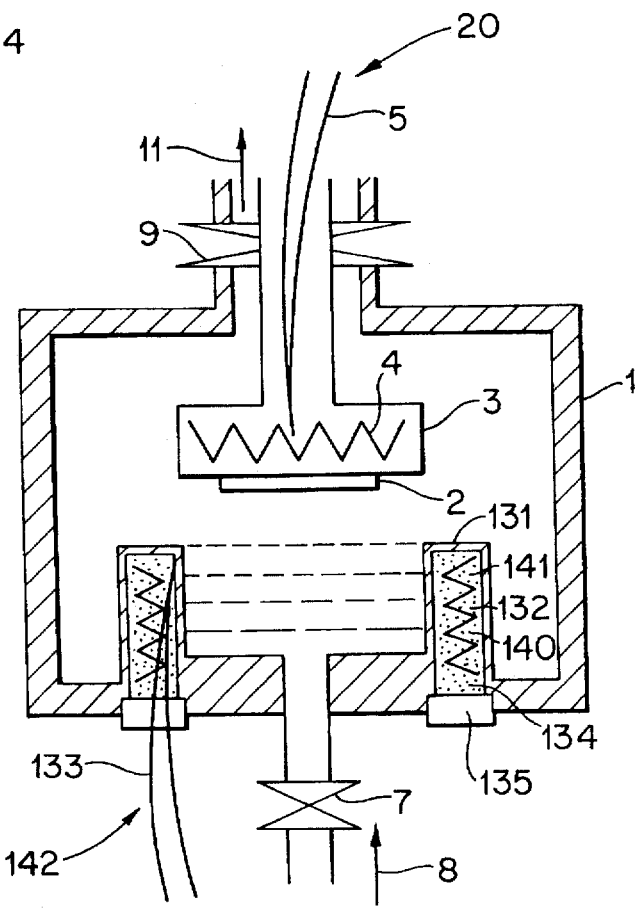
FIG. 5 is a schematic diagram of a thin film forming apparatus according to a first preferred embodiment of the invention.

FIG. 5 is a front sectional view of a thin film forming apparatus according to a first preferred embodiment of the invention.

Figure 1:
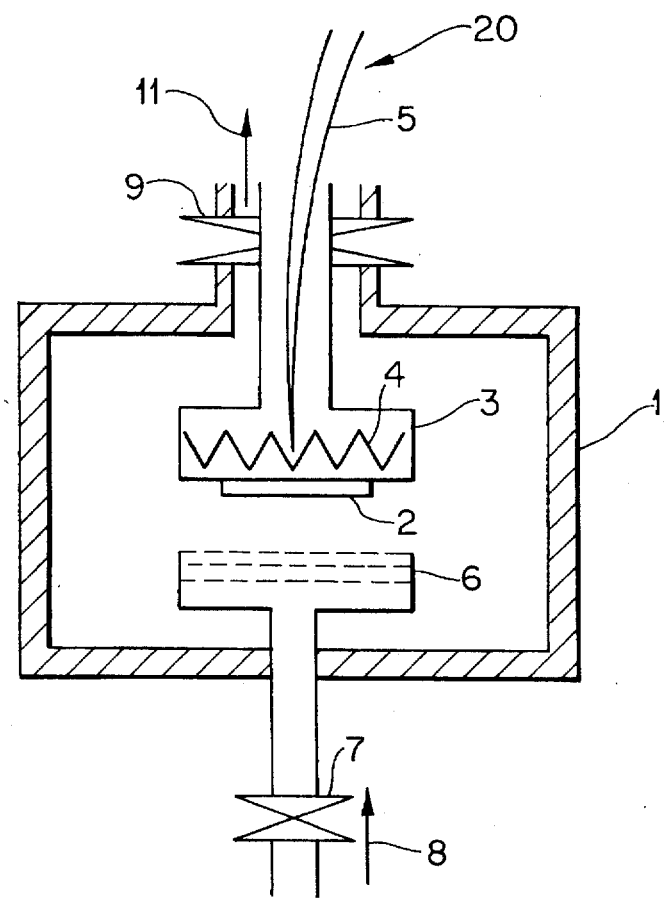
FIG. 1 is a schematic diagram of one conventional thin film forming apparatus;.

It should be noted that the same reference numerals shown in FIG. 1 will be employed as those for indicating the same or similar circuit elements shown in the following FIG. 5.

The particular feature of this preferred embodiment is to employ a distributing plate 131 incorporating a temperature adjusting mechanism 140. The construction of this temperature adjusting mechanism 140 will now be described. The temperature adjusting mechanism 140 is mainly constructed of a heating means 141 mounted on the distributing plate 131, a temperature monitor 142, and a feedback controlling means (not shown in detail). The function of the heating means 141 is to employ a heater 132 which heats the distributing plate 131 from the atmospheric pressure side by way of resistor heating. Instead of this resistor heating, radiation heating such as a halogen lamp may be utilized and the same heating effect can be expected.

Although the feedback controlling means is not illustrated in FIG. 5, a signal obtained by measuring a thermocouple 133 is fed back to a control circuit such as PID control, PI control and ON-OFF control, the temperatures of the distributing plate 131 are controlled by controlling input power to the heater 132 by employing a thiyristor or relay.

Operation of First Thin Film Forming Apparatus

Since the distributing plate 131 is capable of being heated, the following particular advantages according to the first preferred embodiment of the invention are provided. The aluminum film having the better electronic stability can be formed on the surface of the substrate at the low temperature in the high speed with suppressing the growth of, especially, whisker or filament-shaped crystal from the conducted gases containing aluminum such as triethyl aluminum, tri-isobutyl aluminum, aluminum chloride, diethyl aluminum hydride, and di-isobutyl aluminum hydride. The resultant aluminum thin film, or thin film containing aluminum can be utilized in forming interconnects for a semiconductor device, and various types of sensors.

A material gas to form an aluminum thin film by solving this gas at the temperature below 400° C. corresponds to a liquid at the room temperature under the atmospheric pressure, such as tri-isobutyl aluminum.

In case that an aluminum thin film or aluminum alloy thin film is formed by employing tri-isobutyl aluminum as the conducting gas (hydrogen or argon may be employed as the carrier gas), the temperature of the distributing plate 131 is adjusted from 150° to 350° C., "a thermal variation at a first stage" is given to this tri-isobutyl aluminum, and thereafter the heated tri-isobutyl aluminum is supplied to the surface of the substrate 2 which has been heated from 150° to 420° C. At the surface of the substrate, "a thermal variation at a second stage" occurs and a thin film is formed.

In the thin film fabricated according to the above-described method of the preferred embodiment, there is substantially no whisker or filament-shaped crystal, resulting in the thin film having the better quality.

It is not yet obvious that the conditions of tri-isobutyl aluminum which has been treated under "the thermal variation at the first stage" are changed into other molecular structures, or other conditions under which merely the temperature of tri-isobutyl aluminum is increased. However, it is obvious that the particular effect caused by heating the distributing plate 131 can be achieved and the grain sizes of the formed aluminum film are sensitively changed by the temperature of the distributing plate 131. It is also apparent that to obtain the grain size in the good reproduction, the temperature of the distributing plate 131 must be precisely adjusted within a range of ±2° C.

It is preferable that the heating of the distributing plate 131 is performed at the atmospheric pressure side according to the preferred embodiment. The heater 132 is electrically isolated from the distributing plate 131 by employing insulating powder 134. This insulating powder 134 may be alumina or the like, but preferably magnesia powder because of the thermal transfer characteristic from the heater 132.

A problem may be raised such that if the heater 132 is provided at the vacuum side, a metal such as aluminum or the like is deposited on the surface of the heater since this heater is in direct contact with the resolved articles produced from the conducted gas, or with this gas, resulting in variations in the heater characteristics.

Since the temperature of the surface of the heater 132 is considerably higher than that of the distributing plate's surface, either the above-described conducted gas or the resolved articles produced from this gas is resolved and accordingly, an impurity may be mixed into the thin film. As a result, another problem may occur.

However, if, as previously described, the distributing plate 131 is heated from the atmospheric pressure side, these problems can be completely solved, and all of the heat transfer characteristics, uniformity, heat efficiency can be satisfied, which is completely different from the above-described example where the distributing plate 131 is heated from the vacuum side.

In FIG. 5, reference numeral 135 is a lid to fix the insulating powder 134.

According to the thin film forming apparatus with the arrangement shown in FIG. 5, since the heating of the distributing plate 131 provides the better uniformity, and no extraordinary high-temperature portion within the processing chamber 1, a pure degree in the reaction system can be maintained.

In the present embodiment, copper having the better heat transfer characteristic was employed as the material of the distributing plate 131. This copper was selected to be JIS C1020 copper material. However, taking account of the impurity problem, another copper material of JIS C1011 would be preferable.

If only the feature of the thin film forming apparatus according to the preferred embodiment is considered, both JIS C1100 and JIS C1220 copper materials are useful, there is a drawback that impurities may be mixed into the final thin film. However, if such an aluminum film containing the impurities can be allowed, these copper materials are preferable due to their low cost.

Also, as the distributing plate 131, the copper material JIS C1011 to which the vapor deposited film formed of nickel plating or aluminum is attached, may be employed.

Many other materials may be utilized as this distributing plate 131, if they own the better heat transfer characteristics, because the feature of the present invention can be realized. For instance, not only copper, but also the materials belonging to the aluminum group, and a material with a diamond layer may be utilized.

In accordance with the preferred embodiment, the temperature monitor 142 for the distributing plate 131 is also performed from the atmospheric pressure side. The reason why such a temperature monitor arrangement is performed is that the better heat transfer characteristic can be achieved at the atmospheric pressure side, and therefore, the precise temperature of the distributing plate 131 can be measured. There is a problem that when the thermocouple is mounted within the processing chamber 1, and the metal such as aluminum is deposited, a metal film is also deposited on the surface of the thermocouple, and thus the temperature cannot be correctly measured.

In addition, it may be preferable to employ an oil diffusion pump, turbo-molecular pump, or the like, capable of exhausting the processing chamber 1, to a pressure less than $10^{-4}$ Torrs. This is because when the aluminum thin film is formed, the crystal grains of aluminum become rectangular if the residual gas is present within the reaction system, resulting in no good junction among the crystals. Under the background below $10^{-4}$ Torrs, the surface of the crystal grows in better conditions and then, better junction among these crystals can be obtained. As a consequence, the thin film having a lower resistance valuie and a better film quality can be manufactured.

As a vacuum pump, a turbo-molecular pump capable of exhausting an organic system may be useful.

If a turbo-molecular pump is employed, a high vacuum condition can be stably achieved. It could be apparent that the reproducible film is realized.

While the aluminum thin film forming was described with reference to the film forming apparatus shown in FIG. 5, other metal films, semiconductor film, and insulating film may be formed by this film forming apparatus.

Although, according to the conventional film forming method by employing the specific gas having the low isvapor pressure, the gas is heated so as to maintain this to the processing chamber via the pipes, the aim of this gas heating is cmpletely different from the object of the present invention. For example, the above-described heating temperature, in case that tri-isobutyl aluminum is the conducted gas, is about 25° to 100° C. so as to maintain the vapor pressure. Tri-isobutyl alumnum starts to be resolved at about 40° C. to provide di-isobutyl aluminum hydride having the lower vapor pressure than that of tri-isobutel aluminum. As a consequence, the heating temperature is not set so high. Conversely the advant ages of the distributing plate 131 according to the preferred embodiment can be recognized in the temperature range only from 150° to 350° C. In other words, there is a great difference between them.

As previously described in detail, when the film forming method and film forming apparatus are utilized, the thin film having the better film quality can be formed at the lower temperature and higher film forming velocity under the better reproducible condition.

CONSTRUCTION OF SECOND FILM FORMING APPARATUS

Figure 6:
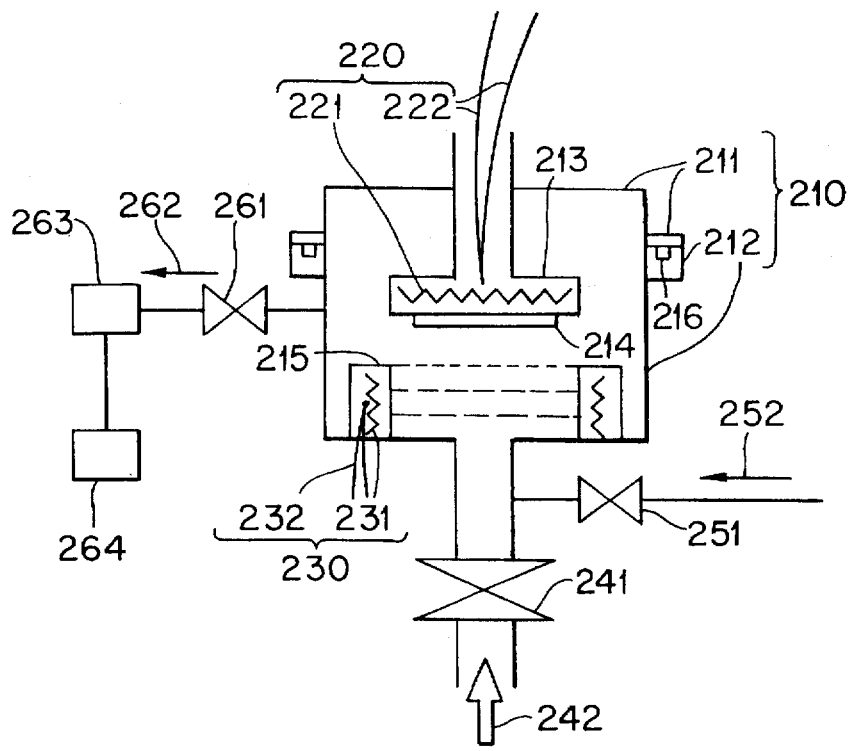
FIG. 6 is a schematic diagram of a thin film forming apparatus according to a second preferred embodiment of the invention.

Referring now to FIG. 6, a construction of a filrm forming apparatus by which the second film forming method can be carried out will be described.

A vacuum chamber 210 is employed, capable of keeping the vacuum condition inside, and is constructed of a chamber lid 211 and a chamber body 212. Both of these components 211 and 212 are sealed by an O-ring 216 in the vacuum condition. A substrate holder 213 is mounted on the side of the chamber lid 211 in the preferred embodiment.

The functions of a substrate holder 213 are to hold a substrate 214 on which surface a desired thin film should be formed and to adjust the temperature of the substrate 214 by means of a temperature adjusting mechanism 220 built therein.

The temperature adjusting mechanism 220 is constructed of a thermocouple 222 in a temperature measurement unit, a heater 221, a heater power supply (not shown in detail) and a controller for this heater power supply (not shown either). This heater power supply may be operated under either a normal 100 V or 200 V commercial AC power source, or a DC power source.

In the preferred embodiment, AC 200 V at 50 Hz power is thyristor-controlled to arrange the above-described heater power source. The control system for this thyristor power source employs the PID control. Although the controlling characteristics are slightly deteriorated, either PI control or relay ON/OFF control may be utilized with lower costs.

A gas distributing plate 215 is provided with the thin film forming apparatus, and to uniformly conduct a gas into a front space of the surface of the substrate 214. This provides an effect of preheating the conducted gas. This specific preheating effect will be discussed later.

In the preferred embodiment, tri-isobutyl aluminum is employed as the gas containing aluminum. In the bubbler under the temperature control (not shown), tri-isobutyl aluminum is bubbled with argon as the carrier gas whose flow rate is controlled, so as to form the gas containing aluminum. The resultant gas is conducted into a vacuum chamber 210 via a valve 241 in the direction indicated by reference numeral 242 shown in FIG. 6.

In the preferred embodiment, 100% disilane is employed as the gas containing silicon.

Disilane stored in a cylinder (not shown) in a liquid condition, is vaporized under the higher pressure condition than by 1 kg/cm² the atmospheric pressure, which is produced by employing a pressure adjuster, and then adjusted to the suitable pressure, whereby the gas containing silicon is generated. This gas containing silicon is conducted via a valve 251 into the vacuum chamber 210 in a direction denoted by an arrow 252.

The exhausting operation for the vacuum chamber 210 is carried out via a valve 261 in a direction denoted by an arrow 262 by a turbo-molecular pump 263 and oil rotary pump 264.

Although an oil diffusion pump may be utilized instead of the turbo molecular pump 263, this pump cannot be operated while the gas containing aluminum and gas containing silicon are continuously flown. A hybrid type turbo-molecular pump capable of having a higher exhausting speed up to 1 Torr can be operated while the gas containing aluminum and gas containing silicon are flown.

A predetermined temperature can be set at the gas distributing plate 215 by means of a temperature adjusting mechanism 230 (heater 231, thermocouple 232 and so on), which is similar to the temperature adjustment of the substrate holder 213. The detailed functions of this member are clearly described in the prior patent application No. 62-172374 (1987) filed by the Applicant, entitled "A METHOD FOR FORMING A FILM AND A FILM FORMING APPARATUS".

Operatuons of Second Thin Film Forming Apparatus

Referring now to FIG. 6, an operation sequence of the thin film forming apparatus will be described.

A chamber lid 211 is opened to open the vacuum chamber 210 at the atmospheric pressure, and then, the substrate 214 is fixed on a substrate holder 213. Thereafter, the chamber lid 211 is closed, and the chamber 210 is exhausted by a vacuum pump to attain a high vacuum pressure lower than that of $10^{-5}$ Torrs. Then, a valve 261 is opened, and the vacuum chamber 210 is exhausted to the high vacuum condition. Under this condition, the temperatures of the substrate holder 213, gas distributing plate 215, and bubbler are set to 370° C., 230° C., and 70° C. respectively. When these temperatures are stabilized and also the vacuum pressure of the vacuum chamber 210 can be set below $10^{-5}$ Torrs, the valve 251 is opened and the gas containing silicon is conducted into the vacuum chamber 210 at the flow rate of 10 sccm. The pressure in the vacuum chamber 210 is adjusted by changing the conductance of exhausting operation by means of the valve 261. In the preferred embodiment, the vacuum pressure is set at approximately 2 Torrs.

Argon is flown as a carrier gas for the bubbling operation at the rate of 40 sccm, a compound containing aluminum is brought into the bubbling operation at the preset bubbling temperature of 70° C. to obtain the gas containing aluminum, and thereafter the valve 241 is opened so that the gas containing aluminum is conducted into the vacuum chamber 210.

It should be noted that this time instant is referred to as "beginning of the film forming".

Furthermore, thereafter, an opening degree of a valve 261 is adjusted to set the pressure within the vacuum chamber 210 at 2 Torrs. It may be possible that a variable conductance valve is employed in series with the valve 261, and an automatic pressure adjusting mechanism is provided to monitor the vacuum pressure in the vacuum chamber 210.

After a predetermined time period (approximately 1.5 minutes) has passed, the valve 241 is closed, which condition is defined as "end of the film forming".

After the valve 261 is fully opened, and the valve 251 is closed whereby the vacuum chamber 210 is again set to the high vacuum pressure, the chamber lid 211 is opened and the substrate is taken out from the vacuum chamber 210.

As a result, an Al-0.3% Si film has been obtained at the velocity of 700 nm/minute. The reflectivity of this thin film was 60% at the light wavelength of 500 nm i.e., had the good film quality.

This result can fully satisfy demands for the previously described mass-production process, i.e., the film forming velocity of 500 nm/minute and reflectivity of 50%. If the flow rate of disilane is increased, the amount of silicon contained in the resultant thin film is higher than 0.3%. Also, in this case, silicon is often deposited (or segregated) among the aluminum grains. However, this deposited silicon is also involved by the meaning of the "alloy" according to the invention. As previously described above, the film forming method for combining the gas containing aluminum with disilane according to the present invention is very useful for performing the mass production.

If disilane is used in the film forming method of the present invention, the surface condition of the aluminum alloy film can be improved. Although the particular advantages such that the higher film forming velocity can be realized in addition to the above surface improvement, the detailed mechanism of such a film forming is not yet known. Nevertheless, it may be considered that these particular advantages according to the present invention could be achieved by the following five effects:

(1) A getter effect of the residual oxygen

As tri-isobutyl aluminum is employed as an aluminum contained compound, this compound has no color, is transparent, and oily product. When this compound is conducted into the vacuum chamber 210, it is adsorbed to the wall of the vacuum chamber 210. Thereafter, the amount of gas emission from the wall of the vacuum chamber 210 is considerably increased. As a result, even if the vacuum chamber having the good sealing means is employed, the vacuum pressure of the vacuum chamber 210 reaches only about $10^{-6}$ Torrs, not so high vacuum condition.

It is known that according to the vapor deposition or sputtering method so as to form an aluminum film, the high vacuum pressure chamber at approximately $10^{-8}$ Torrs is required in order to eliminate the residual oxygen. As previously described in detail, the CVD chamber cannot satisfy this condition.

As a consequence, according to the present invention, the vacuum pressure of the vacuum chamber 210 is once reduced to $10^{-5}$ Torrs, and thereafter, the residual oxygen which has entered into the vacuum chamber 210 when the substrate 214 is replaced by another substrate, is subject to the chemical reaction with the gas containing silicon (disilane in the preferred embodiment) for consuming purposes. Subsequently, the gas containing aluminum is conducted into the vacuum chamber. As a result of this operation, the adverse effect caused by oxygen remained while the aluminum alloy thin film is formed, could be minimized so that the resultant film having the better surface condition and reflectivity of at least 60% could be manufactured.

To reduce the contamination amount of oxygen when the substrate is replaced, the above-described construction of the film forming apparatus is modified. That is, a substrate exchanging chamber is newly employed so as to separate this substrate exchanging chamber from the deposition chamber, both chambers are communicated under the vacuum condition, and furthermore, a substrate receiving/delivering mechanism is coupled thereto. Then, the similar effect can be achieved.

Figure 7:
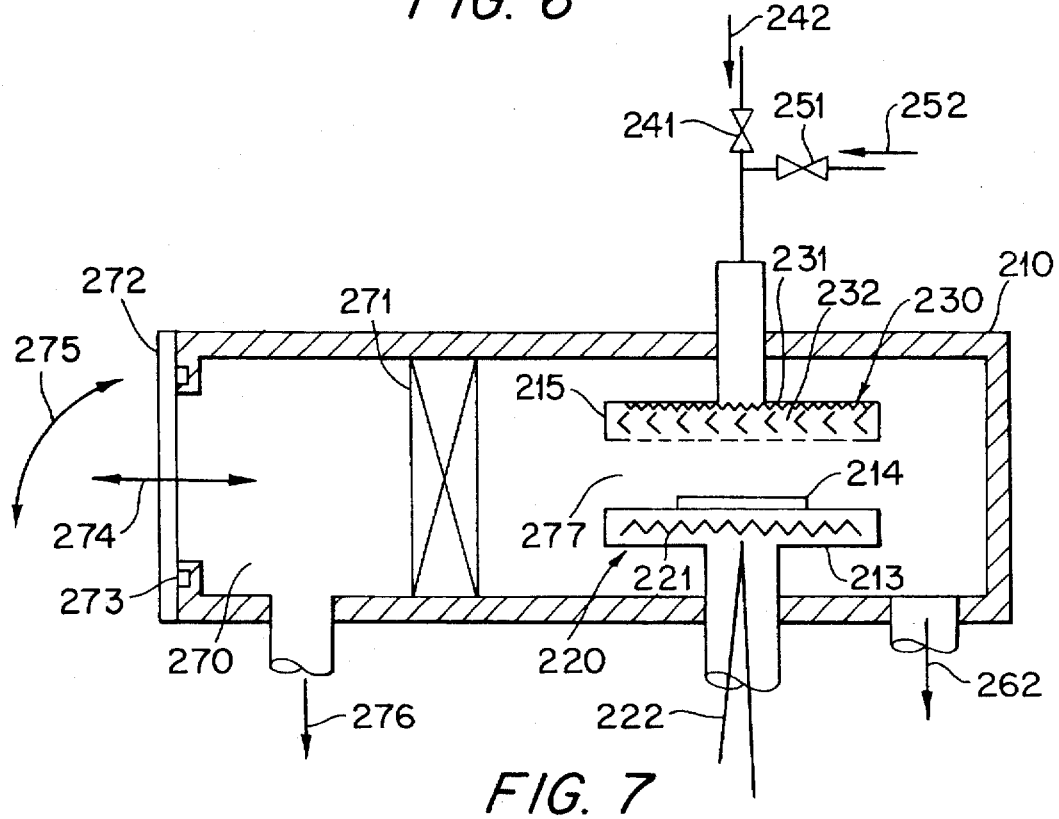
FIG. 7 is a schematic diagram of another modified thin film forming apparatus according to the second preferred embodiment.

Referring now to FIG. 7, one concrete example of the above-described apparatus will be described. It should be noted that the same reference numerals employed in FIG. 6, denote the same or similar components shown in FIG. 7.

The basic arrangement of this apparatus is such that while a substrate exchanging chamber 270 is separated from a deposition chamber 277, both chambers 270, 277 are designed to be communicated with each other via a valve 271 in the vacuum condition, and also a substrate receiving/delivering mechanism (not shown) is employed therein.

On an end portion of the substrate exchanging chamber 270, a lid 272 for receiving/delivering the substrate is attached, which is opened/closed in a direction denoted by an arrow 275. This lid 272 is sealed by an O-ring 273 under the vacuum condition.

The receiving/delivering operations of the substrate to be processed under the vacuum condition are performed by opening/closing this lid 272 in a direction indicated by an arrow 274. That is, under the condition that the lid 272 is being opened, the substrate 214 is carried into the substrate exchanging chamber 270 from the atmospheric room. Subsequently, the lid 272 is closed, and the substrate exchanging chamber 270 is exhausted by an exhausting system (not shown) in a direction indicated by an arrow 276. Then, when the substrate exchanging chamber 270 is fully exhausted, the gate valve 271 is opened, the substrate 214 is transported into the deposition chamber 277, and mounted on the substrate holder 213. Thereafter, the gate valve 271 is closed. When the processing of the substrate is accomplished, the resultant substrate is delivered out from the deposition chamber 277 in the order of the operation sequence which is completely opposite to that of the substrate reception.

As such a substrate exchanging chamber 270 is employed in the film forming apparatus, there is no risk that the deposition chamber 277 is undesirably exposed to the atmospheric pressure while the substrate is received, or delivered with the result that the adverse effect caused by the residual gas (particularly, oxygen) within the deposition chamber on the deposited thin film can be minimized.

(2) Reducing process of aluminum contained gas by silicon contained gas

It is known that a gas containing silicon has a reducing process (or effect).

In, for instance, the low pressure CVD method of $WF_6$, if a little quantity of silane ($SiH_4$) is conducted, the film forming velocity of the tungsten film is increased. This is caused by the reducing effect of silane.

Since the film forming method according to the present invention employs different compounds, the above-described measurement may not immediately be applied thereto. However, in fact, since the film forming velocity could be increased, the above-identified same effect could be additionally realized even in the film forming of the aluminum alloy film.

(3) Silicon alloy of aluminum (Aluminum alloy with silicon)

The aluminum film for interconnecting a semiconductor device has such a drawback that the circuit breakdown or shortcicuit may readily occur due to the electromigration or the like. It is well known that this electromigration can be prevented by conducting (or adding or mixing) a small amount of silicon into aluminum.

If the silicon contained gas is additionally used according to the invention, it is possible to add silicon into the aluminum film which is being formed. It seems that the above-described two-stepped measurement is not required which has been performed by M. J. Cooke et al. This fact is extremely important for the film forming industries because the film forming process can be simplified.

Improvement in boundary characteristics with the silicon substrate

The aluminum alloy interconnection is often in contact with the substrate. When a silicon wafer is employed as the substrate, and the thin film forming is carried out by employing the conventional method according to M. J. Cooke et al., the surface of the aluminum substrate is etched by aluminum because silicon is very easily diffused into aluminum. As a result, concaves and convexes are produced at the boundary between aluminum and silicon, so that the boundary characteristics are deteriorated.

In other words, when the aluminum film is formed on the silicon substrate according to the method by M. J. Cooke et al., and only the aluminum alloy film is wet-etched after silicon is added thereto, the concaves and convexes are produced on the silicon substrate. This implies that silicon of the substrate is diffused into the aluminum film during the formation of the aluminum film.

However, according to the film forming method of the present invention, while the aluminum is being filmed, and simultaneously silicon is added thereto, no concave or convex deformation is observed on the surface of silicon even if the aluminum alloy film is formed.

This fact may be the reason why the boundary characteristics between aluminum and silicon can be improved according to the present invention.

(5) Occurrence of a growth-nucleus on silicon oxide

Since it is difficult to produce a growth-nucleus of aluminum on silicon oxide, a flat aluminum film could not be formed.

However, according to the thin film forming method of the invention, since disilane is dissolved and thus, the growth-nucleus of aluminum is produced on silicon oxide, and the occurrence density of the growth-nucleus is advantageously increased, the better flatness thin film can be formed not only on silicon, but also on silicon oxide.

In the usual silicon devices, the aluminum alloy films for the interconnecting purpose are utilized with the junction to the silicon substrate, and formed as a pattern on the silicon oxide film formed on the silicon substrate.

Because the uniformly flat thin film can be formed simultaneously on the silicon and silicon oxide by employing the CVD measurement according to the invention, this feature of the present invention is very useful so as to realize the better step coverage characteristic by the CVD method.

While if has been described in detail in the above, the thin film forming method according to the present invention can provide the following various advantages in the thin film forming industries.

In the thin film forming apparatus shown in FIG. 6, tri-isobutyl aluminum was employed as the aluminum contained compound. If the bubbling temperature is set higher than the above bubbling temperature and the peripheral portion of the valve 241 is heated, it may be possible to employ di-isobutyl aluminum hydride, which can achieve the same result as in tri-isobutyl aluminum. Alsor di-isobutyl aluminum hydride may be utilized.

Similarly, other alumi num con tand contaide compounds such as trimethyl aluminum and triethyl aluminum may be utilized. However, there is a drawback that if trimethyl aluminum and triethyl aluminum are employed, a small quantity of carbon remains in the resultant thin film.

Also, as a silicon compound, monosilane and trisilane other than disilane may be employed. Although trisilane is more useful than disilane a there is the practical problem that a large qu an tity of highly pure trisilane is not avaiable at present. In addition, another compound such as dichloro silane may be utilized.

Furthermore, if a copper contained compound is conducted into the vacuum chamber in accordance with the. same conducting way of the silicon contained compound, copper can be added into the aluminum film.

Then, as the copper compound, diacetylacetonato copper, cyclopentadienyl copper triethyl posphin addact, bis (dipivaloylmethanato) copper, bis(hexafluoroacetylacetonato) copper or the like may be employed.

When the aluminum contained compound, silicon contained compound, and copper contained compound are simultaneously employed, the aluminum-silicon and copper alloys can be formed.

It should be noted that these aluminum contained compound, silicon contained compound, and copper contained compound are to use the carrier gas in combination therewith.

It could be confirmed that either the electromigration or stress-migration could be furthermore improved if employing the above-described aluminum-silicon copper alloy film (as previously described, although this film is described as an "alloy", correctly speaking, this film condition is such that silicon and copper are segregated in and at boundaries of the grains). In addition, not only the above described films of ternary alloy series, but also films of multi-components alloy series may be similarly formed.

In the aluminum contained compound, an inert gas and hydrogen may be utilized. If tri-isobutyl aluminium is employed as the aluminum contained compound, isobutylene which is produced from a resolved product thereof may be employed as the carrier gas.

A copper contained compound may be useful to form a thin film by causing sublimation of this compound by use of the inert gas to form the copper contained gas when a substance, the vapor pressure of which is relatively low under a solo condition thereof, e.g., diacetylacetonato cooper, is utilized.

As previously described in detail, various modifications according to the invention may be realized. The major feature according to the invention is that by employing the CVD method wherein the metal contained gas is used with the aluminum contained gas, the aluminum alloy film having the better surface condition can be formed at higher rate (or velocity). Therefore, according to the present invention, the above-described thin film forming apparatus is not limited to employ the previously described carrier gas; the methods for forming the aluminum contained gas, silicon contained gas, and copper contained gas; the means for controlling the temperature; the method for heating the substrate; the construction of the vacuum chamber; the vacuum pump: the vacuum exhausting system and While if has been described in detail, the aluminum film having the better surface condition can be formed at the rather high rate (or velocity), and the film forming method can be applied to the mass production of the thin film according to the invention.

Aluminum Films for Interconnecting Material of Electronic Device

Figure 8:
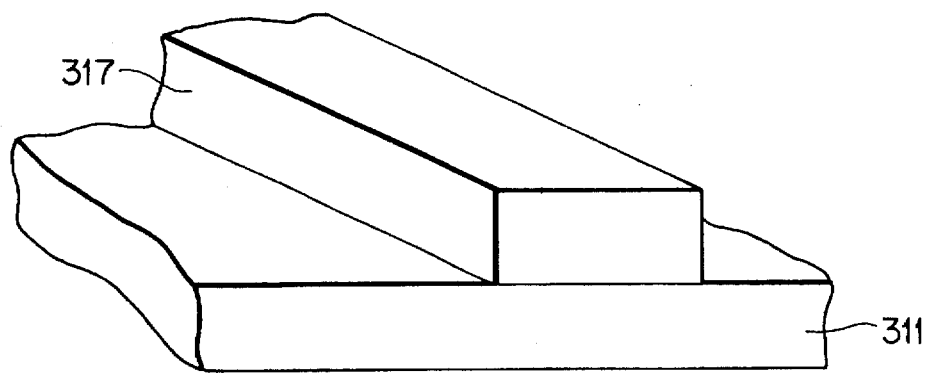
FIG. 8 schematically illustrates conditions of an aluminum film formed as an interconnecting material for an electronic device according to a third preferred embodiment of the invention.
Figure 9:
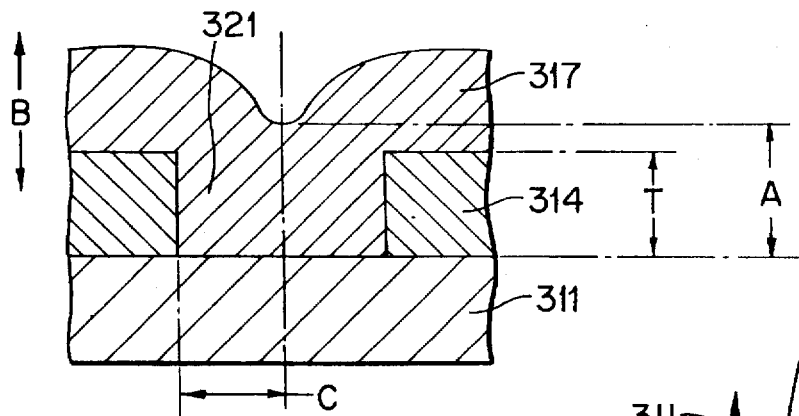
FIG. 9 is a sectional view for illustrating a step coverage characteristic of the aluminum film shown in FIG. 8.
Figure 10:
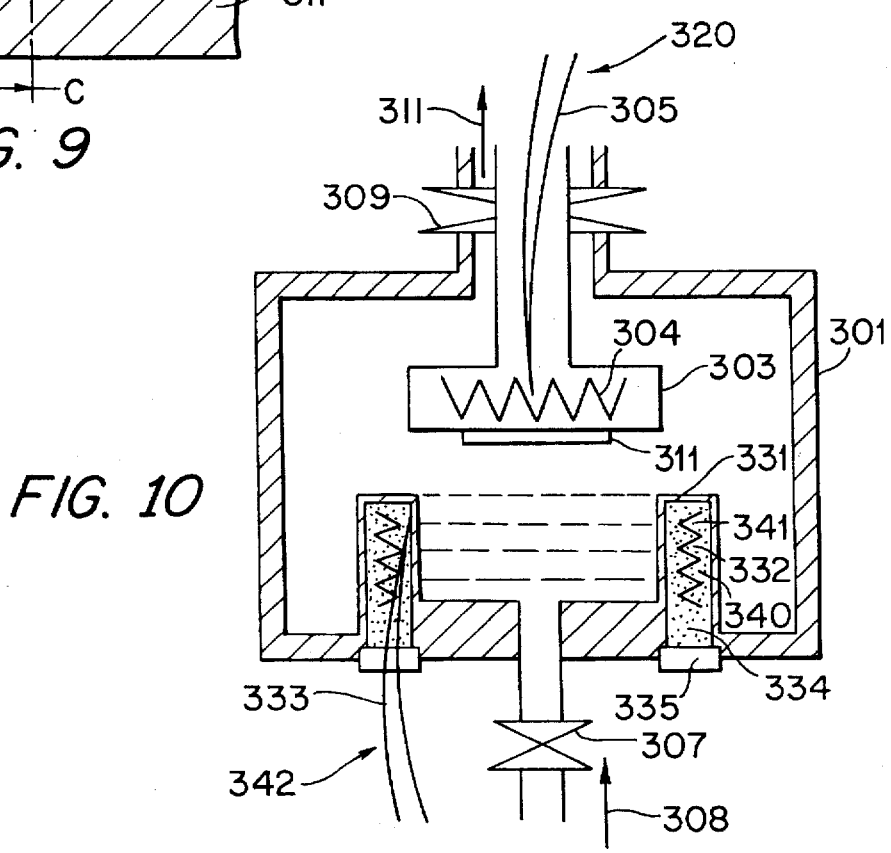
FIG. 10 is a schematic diagram of a thermal CVD apparatus by which the aluminum film of FIG. 8 is formed.

FIG. 8 illustrates conditions of an aluminum film. formed as an interconnecting material for an electronic device, according to the invention. FIG. 9 is a sectional view for illustrating a step coverage characteristic of the aluminum film shown in FIG. 8. Furthermore, FIG. 10 is a front sectional view of a thermal. CVD apparatus by which the aluminum film of FIG. 8 is formed.

Figure 2:
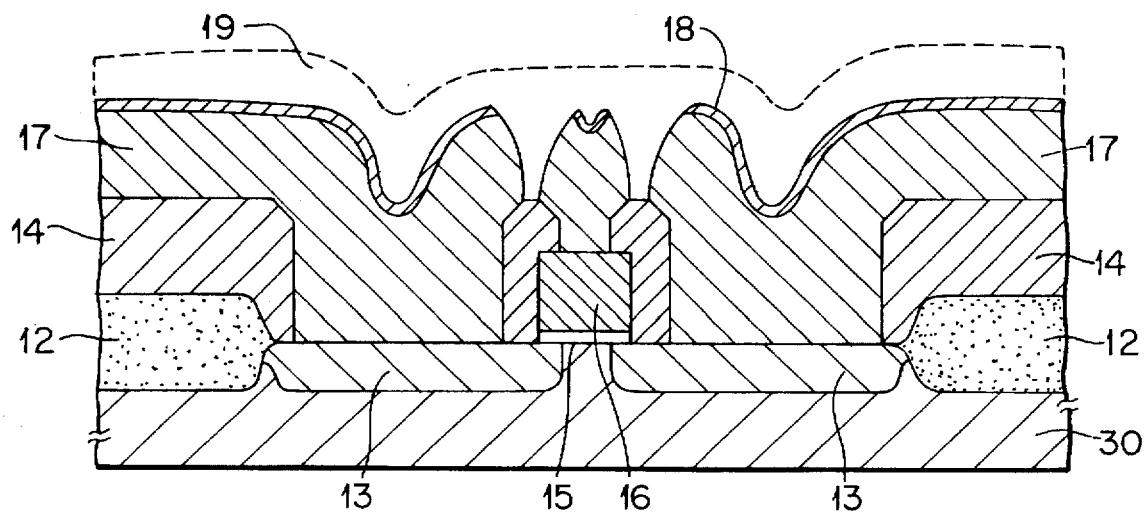
FIG. 2 is a schematic sectional view of another conventional electronic device.

It should be noted that since the structure of the electronic device according to this preferred embodiment of the invention is the same as that of FIG. 2, no further explanation is made in the following description. Also, the same reference numerals will be employed so as to denote the same elements as those in FIG. 2.

As illustrated in FIG. 8, a flat aluminum film 317 having a better film quality has been formed on a 17 silicon substrate 311. To manufacture such an aluminum film 317, the thermal CVD apparatus shown in FIG. 10 is utilized.

Reference numeral 301 indicates a processing chamber which is so. constructed to keep the inside space thereof under the air-tight condition. A substrate holder 303 is mounted inside the processing chamber 301 of the thermal CVD apparatus shown in FIG. 10, which has two functions; to, first, hold the substrate 311 and, second, adjust the temperature of the substrate 311.

A temperature adjusting mechanism 320 for adjusting the temperature of the substrate holder 303 will now be described. A heater 304 is employed to heat the substrate holder 303 by means of resistor heating (other heating methods such as radiation heating may be utilized). A thermocouple 305 is used to monitor the temperature of the substrate holder 303. A temperature sensing resistor may be employed instead of the thermocouple 305 as the temperature monitor. A measurement signal from the thermocouple 305 is input into a control circuit such as PID control, PI control, ON-OFF control and the like (not shown in detail), and input power to the heater 304 is controlled by employing a thyristor or relay so that the temperature of the substrate holder 303 is adjusted. The substrate holder 303 may be cooled, if required, to control the temperature thereof by way of the heating/cooling methods.

A predetermined gas 308 is conducted via a valve 307 from a gas supply apparatus (not shown). To uniformly supply this gas 308 into the substrate surface, a distributing plate 331 is employed which includes narrow holes such as multi-overlapped meshes for passing a large quantity of gas therethrough. A temperature adjusting mechanism 340 is incorporated into this distributing plate 331.

The construction of this temperature adjusting mechanism 340 will now be described. The temperature adjusting mechanism 340 is mainly constructed of a heating means 341 mounted on the distributing plate 331, a temperature monitor 342, and a feedback controlling means (not shown in detail). The function of the heating means 332 is to heat the distributing plate 331 from the atmospheric pressure side by way of resistor heating. Instead of this resistor heating, radiation heating such as a halogen lamp may be utilized and the same heating effect can be expected. The heater 332 is electrically isolated from the distributing plate 331 by employing insulating powder 334. As this insulating powder, alumina may be employed. However, magnesia powder is preferable, taking account of the heat transfer characteristic received from the heater 332.

Although the feedback controlling means is not illustrated in FIG. 10, a signal obtained by measuring a thermocouple 333 is fed back to a control circuit such as PID control, PI control and ON-OFF control, the temperatures of the distributing plate 331 are controlled by controlling input power to the heater 332 by employing a thyristor or relay.

Reference numeral 335 indicates a lid for fixing the insulating powder 334.

To form the aluminum film 317 as the interconnecting material by employing the thin film forming apparatus having the above-described structure, the following film forming conditions are required as one example.

The pressure within the processing chamber 301 is set to 2 Torrs; tri-isobutyl aluminum is employed as the conducted gas; argon (the flow rate from 50 to 200 sccm) is used as the carrier gas; the temperature of a gas cylinder is set to a range from 50° to 90° C.; the temperature of the distributing plate 331 is set to 230° C. Then, "a thermal variation at a first stage" is given to tri-isobutyl. aluminum, and subsequently, this tri-isobutyl aluminum is supplied to the substrate 311 which has been heated from 350° to 400° C. As a consequence, "a thermal variation at a. second stage" occurs on the surface of the substrate 311, so that the aluminum film 317 can be formed on the substrate 311 at the velocity of 1 μm/min. Consequently, the surface of the resultant thin film 317 becomes very flat,as compared with the surface condition of the prior art thin films formed by the conventional thermal CVD as shown in FIGS. 2 and 3.

That is, the surface reflectivities of the prior art thin films are on the order of 10 to 20%, and the concaves and convexes are formed on the surfaces thereof, which are observed by way of a scanning electron microscope (not shown). On the contrary, the surface reflectivity of the aluminum film formed according to the third preferred embodiment is more than 95% under the condition that the thickness of this film is 1 μm and the wavelength of the light is 220 to 800 nm. This implies that the flatness of this aluminum film can be improved, as compared with that of the prior art film formed by the known sputtering method.

Figure 3:
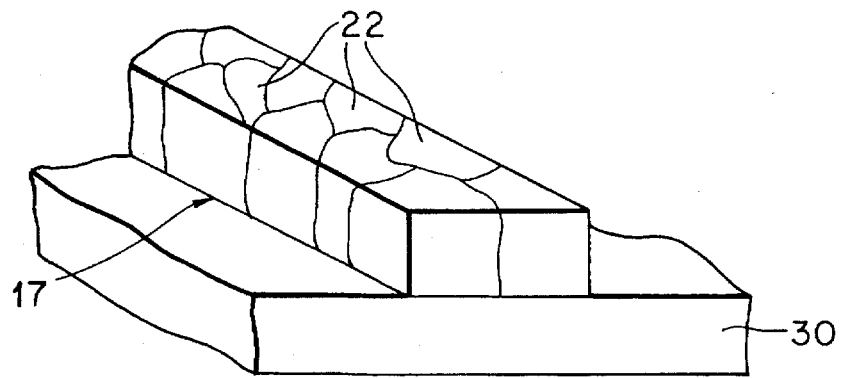
FIG. 3 is a schematic perspective view of grains fabricated in the electronic device shown in FIG. 2.

As illustrated in FIG. 8, the aluminum film 317 formed on the substrate 311 is different from a film obtained by sputtering method and has substantially no grain 22 as shown in FIG. 3.

Also, if the aluminum thin film is formed under the above-described film forming conditions, an epitaxial growth of aluminum (crystal orientation: (111) surface) can be produced on a silicon substrate (crystal orientation: (111) surface), and the streak pattern can be obtained by RHEED. Similarly, an epitaxial growth of Al-Si (crystal orientation: (100) surface) can be formed on a silicon substrate (crystal orientation: (100) surface).

Figure 4:
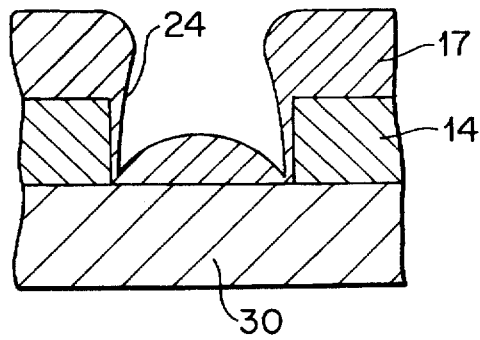
FIG. 4 is a schematic sectional view of a step coverage formed in the electronic device shown in FIG. 2.

As illustrated in FIG. 9, the covering characteristics at the step coverage 321 can be considerably improved, as compared with that of the thin film formed by the cluster ion beam vapor deposition method as illustrated in FIG. 4. As a result, there is no risk that the circuit breakdown occurs.

FIG. 9 illustrates the dimensions associated with the various components of the device—aluminum film thickness in a void step formed in layer 314;

B is equal to film thickness of the aluminum film on top of layer 314;

C is equal to thickness of aluminum film bounding a corresponding edge of layer 314; and T is equal to height of layer 314.

In addition, as to the resistivity of the resultant film according to the third preferred embodiment, an have the resistivity of 2.7 μΩ·cm, even when this film has the flat surface and a thickness of 1 μm. This can be easily realized with the above thin film forming apparatus by controlling the parameters. Mixture of carbon into the resultant film does not substantially occur, say less than about 20 ppm (atoms/cc). In order to get a practical AL electrode, Al wiring or Al interconnection of an electronic device, the amount of mixture of carbon atoms included as impurity in the film should be sufficient so as to be equal to or less than about 200 ppm (atoms/cc). An Al film with the carbon mixture amount equal to or less than 20 ppm (atoms/cc) may also be sufficiently utilized as an electrode, wiring or interconnection of the electronic device. Of course, even though the amount of mixture of carbon atoms into an Al film may be more than 20 ppm (atoms/cc), if the Al film satisfies the following conditions, the Al film may be utilized as an electrode, wiring or interconnection of an electronic device without occurrence of disconnection and cross connection. The conditions are: the Al film has included therein carbon atoms in an amount equal to or less than about 200 ppm (atoms/cc), is a single crystalline layer and has good step coverage. When this resultant film was annealed in $N_2$ atmosphere, at 430° C., and for 40 minutes no hillock was produced. This means that this resultant film has the particularly superior feature than that of the film formed by the sputtering method.

The aluminum film which has been formed by employing the above-described film forming apparatus shown in FIG. 10, can provide the following particular advantages. That is to say, the surface flatness is very good, substantially no impurity is mixed. The step coverage wcvering characteristics can be improved and the superior crystallinity is realized. Therefore, this thin film is very suitable for the interconnecting materials of the electronic devices.

While an electronic device is manufactured, after an aluminum film has been formed by way of ths above-described method, as the interconnecting materials how the electronic device, the resultant film is etched and patterned. On the resultant aluminum film, a tungsten silicon film 318 having a thickness of on the order of 200 Å is formed by way of the CVD method, or sputtering method, which is similar to the forming of the normal aluminum interconnecting material. This forming process is performed so as to lower the surface reflectivity, otherwise the exposure and patterning processes cannot be executed because the reflectivity of the above-described aluminum film is high.

Another embodiment of the present invention is described herein. First, $SiO_2$ layer of about 1 μm is formed on a monocrystalline silicon wafer. Then the $SiO_2$ layer is subjected to etching treatment to form an opening or openings of about 1 μm therein. Next, aluminum layer is grown inside the opening on the wafer. The selective growth of the aluminum is carried out by using the apparatus shown in FIG. 10 under the condition that the temperature of the substrate holder 303 be 250° C. and that of the distributing plate 331 150° C. A reaction gas, such as tri-isobutyl aluminum (TIBA), is introduced together with a carrier gas, such as Ar (argon), into the processing chamber 301. The flow rate of tri-isobutyl aluminum (TIBA) is about 22.6 SCCM and the flow rate of argon is about 30 SCCM. At that time, the pressure inside the processing chamber 301 is 1 Torr. The tri-isobutyl aluminum gas and the argon gas are introduced into the processing chamber 301 for a duration of about 16 minutes to selectively grow an aluminum layer on the (511) surface of the Si wafer.

Figure 11:
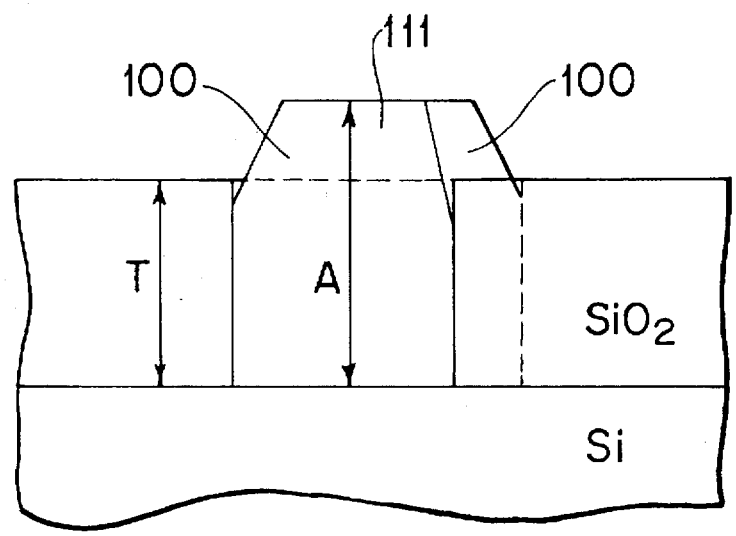
FIG. 11 is an enlarged cross-sectional view taken along line A—A of FIG. 12.
Figure 12:
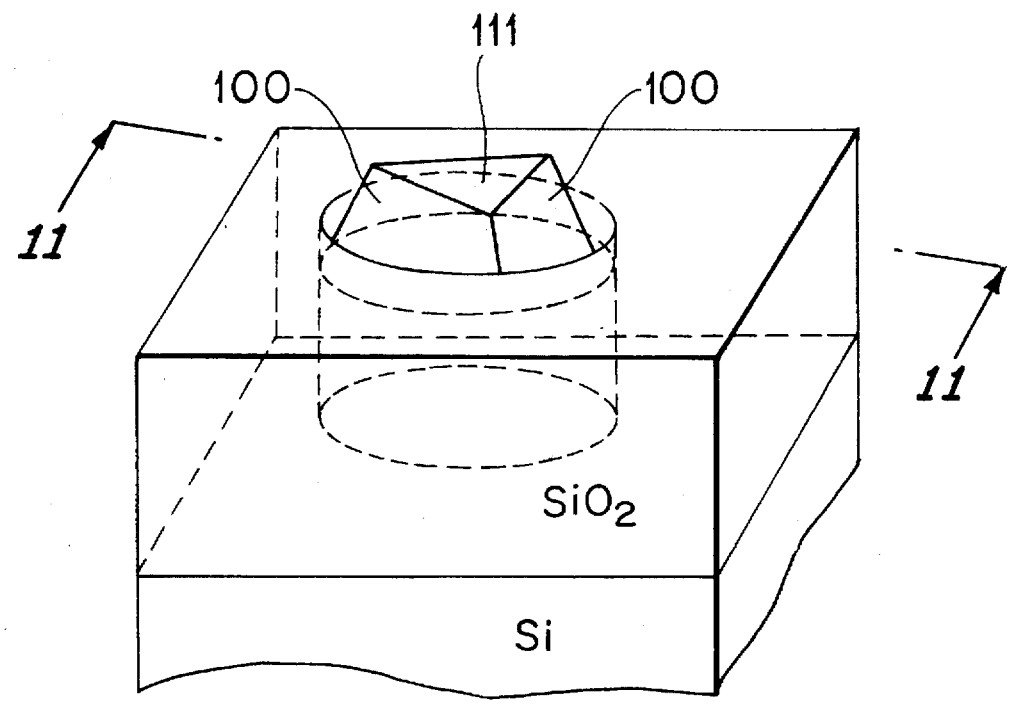
FIG. 12 is an enlarged perspective view of an aluminum layer obtained in the opening of an oxide layer formed on a semiconductor wafer

FIGS. 11 and 12 show the obtained aluminum layer. FIG. 11 is a magnified cross section taken along the II—II line of FIG. 12, and FIG. 12 is a magnified perspective view of the aluminum layer obtained in the opening of the $SiO_2$ layer formed on the monocrystalline silicon wafer. As is understood from FIGS. 11 and 12, the aluminum layer is formed only inside the opening, and the top surface of the aluminum layer is (111) Facet, which means that the aluminum layer is crystalline aluminum. In the example shown in FIGS. 11 and 12, the aluminum grown crystalline layer does not fully fill the opening, but it is possible to fill the opening with the aluminum crystalline layer after growing the aluminum crystalline layer for a long time by introducing the (tri-isobutyl aluminum gas into the chamber. If the substrate has a (111) surface, it is possible to grow aluminum crystalline layer with a top surface of (111) on the (111) substrate surface. If the substrate has a (100) surface, it is also possible to grow aluminum crystalline layer with the top surface of (100) on the (100) substrate surface.

The thus obtained monocrystalline aluminum layer is suitable for use as an interconnection to be formed inside a through-hole in the three dimensional IC structure.

Although the explanation was made on the semiconductor device employing the aluminum film as the interconnecting material in the third preferred embodiment, the present invention is not limited to this embodiment. Many other electronic devices such as opto-electronic devices may be involved in the scope of the present invention.

By employing the aluminum films formed by the predetermined thermal CVD method as the interconnecting materials for the electronic devices, no electromigration and stress-migration, and furthermore hillock occur in the resultant electronic devices.

What is claimed is:

1. A method for constructing an interconnecting material for an electronic device comprising the steps:

depositing a flat substrate;

bonding an insulative layer to a first surface of the substrate;

forming apertures in the insulative layer for exposing the substrate;

bonding an aluminum film, having a single crystal layer, to a second surface of the insulative layer by thermal chemical vapor deposition (CVD);

the aluminum film having a thickness throughout the apertures that is greater than the thickness of the insulative layer, to ensure that the film completely fills the apertures.

2. A method for constructing an interconnecting material for an electronic device comprising the steps:

depositing a flat substrate;

bonding an insulative layer to a first surface of the substrate;

forming apertures in the insulative layer for exposing the substrate;

bonding an aluminum alloy film, having a single crystal layer, to a second surface of the insulative layer by thermal chemical vapor deposition (CVD);

the aluminum alloy film having a thickness throughout the apertures that is greater than the thickness of the insulative layer, to ensure that the film completely fills the apertures.

3. A method as claimed in claim 1, wherein said aluminum film comprises the same crystal orientation as that of said substrate.

4. A method as claimed in claim 1, wherein the surface reflectivity of the aluminum or aluminum alloy film is more than 95%, as measured by using the wavelength of light within 200 to 800 nm.

5. A method as claimed in claim 1, wherein the film is an electrode, wiring or interconnection having included therein an impurity in an amount equal to or less than 200 pm (atoms/cc).

6. A method as claimed in claim 5, wherein said impurity added to said Al film comprises carbon atoms.

7. A method as claimed in claim 2, wherein said aluminum alloy film is an aluminum-silicon alloy film.

8. A method as claimed in claim 2, wherein said aluminum alloy film is an aluminum-copper alloy film.

9. A method as claimed in claim 2, wherein said aluminum alloy film is an aliminum-copper-silicon alloy film.

10. A method as claimed in claim 2, wherein said aluminum alloy film comprises the same crystal orientation as that of said substrate.

11. A method as claimed in claim 2, wherein the surface reflectivity of the aluminum alloy film is more than 95%, as measured by using the wavelength of light within 200 to 800 nm.

12. A method as claimed in claim 2, wherein the film is an electrode, wiring or interconnection having included therein an impurity in an amount equal to or less than 200 pm (atoms/cc).

13. A method as claimed in claim 12, wherein said impurity added to said Al film comprises carbon atoms.

14. A method for constructing an interconnecting material for an electronic device comprising the steps:

depositing a flat substrate;

bonding an insulative layer to a first surface of the substrate;

forming apertures in the insulative layer for exposing the substrate;

bonding an aluminum film, having a single crystal layer, to a second surface of the insulative layer by thermal chemical vapor deposition (CVD);

the aluminum film having a thickness throughout the apertures that is greater than the thickness of the insulative layer, to ensure that the film completely fills the apertures; wherein the film is created by heating a gas of tri-isobutyl aluminum undergoing two stages of thermal variation, the first from 150 to 350 degrees C., the second variation being from 150 to 420 degrees C.

15. A method for constructing an interconnecting material for an electronic device comprising the steps:

depositing a flat substrate;

bonding an insulative layer to a first surface of the substrate;

forming apertures in the insulative layer for exposing the substrate;

bonding an aluminum alloy film, having a single crystal layer, to a second surface of the insulative layer by thermal chemical vapor deposition (CVD);

the aluminum alloy film having a thickness throughout the apertures that is greater than the thickness of the insulative layer, to ensure that the film completely fills the apertures; wherein the film is created by heating
   (a) a gas of tri-isobutyl aluminum undergoing two stages of thermal variation, the first from 150 to 350 degrees C., the second variation being from 150 to 420 degrees C.; and
   (b) a gas of a compound containing a metal other than aluminum.

* * * * *